(12) United States Patent
Maier

(10) Patent No.: US 6,393,053 B1
(45) Date of Patent: May 21, 2002

(54) DIGITAL OUTPUT UNIT

(75) Inventor: Willi Maier, Oppenau (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/509,614
(22) PCT Filed: Sep. 24, 1998
(86) PCT No.: PCT/DE98/02857
§ 371 Date: May 31, 2000
§ 102(e) Date: May 31, 2000
(87) PCT Pub. No.: WO99/17262
PCT Pub. Date: Apr. 8, 1999

(30) Foreign Application Priority Data

Sep. 29, 1997 (DE) .................................. 297 17 369 U

(51) Int. Cl.⁷ .................................................. H04B 3/46
(52) U.S. Cl. ....................................................... 375/224
(58) Field of Search ................................. 375/224, 257, 375/377, 228; 333/24 R; 327/183, 211, 212

(56) References Cited

U.S. PATENT DOCUMENTS 3,803,355 A * 4/1974 Fiedler et al. ............ 178/69 C
3,942,098 A * 3/1976 Haass ........................ 375/224
5,119,096 A * 6/1992 Marschall .................. 341/119
5,554,947 A * 9/1996 Saitou et al. ............... 327/165
5,623,190 A * 4/1997 Tajima et al. .............. 318/800

FOREIGN PATENT DOCUMENTS

CH    676 393    1/1991
EP    0 735 375   10/1996

OTHER PUBLICATIONS

K. Kirk, "Remote Logic Drive", New Electronics, vol. 9, No. 22, Nov. 16, 1976, p. 19, XP002032864, Described in the specification.
Siemens Catalog ST 70, 1997 Edition, pp. 4/16–4/17, Described in the specification.

* cited by examiner

Primary Examiner—Chi Pham
Assistant Examiner—Khai Tran
(74) Attorney, Agent, or Firm—Kenyon & Kenyon

(57) ABSTRACT

To enable electrical isolation, conventional digital input units have a first and a second optocoupler for each input channel. One optocoupler is provided to transmit the input signal, i.e., to transmit the status information logical "0" and logical "1", while the other optocoupler is provided to transmit wire breakage information to a wire breakage monitoring unit which monitors the lines connected to the input circuit. A digital input unit is proposed which has only one optocoupler for transmitting the status and wire breakage information.

3 Claims, 1 Drawing Sheet

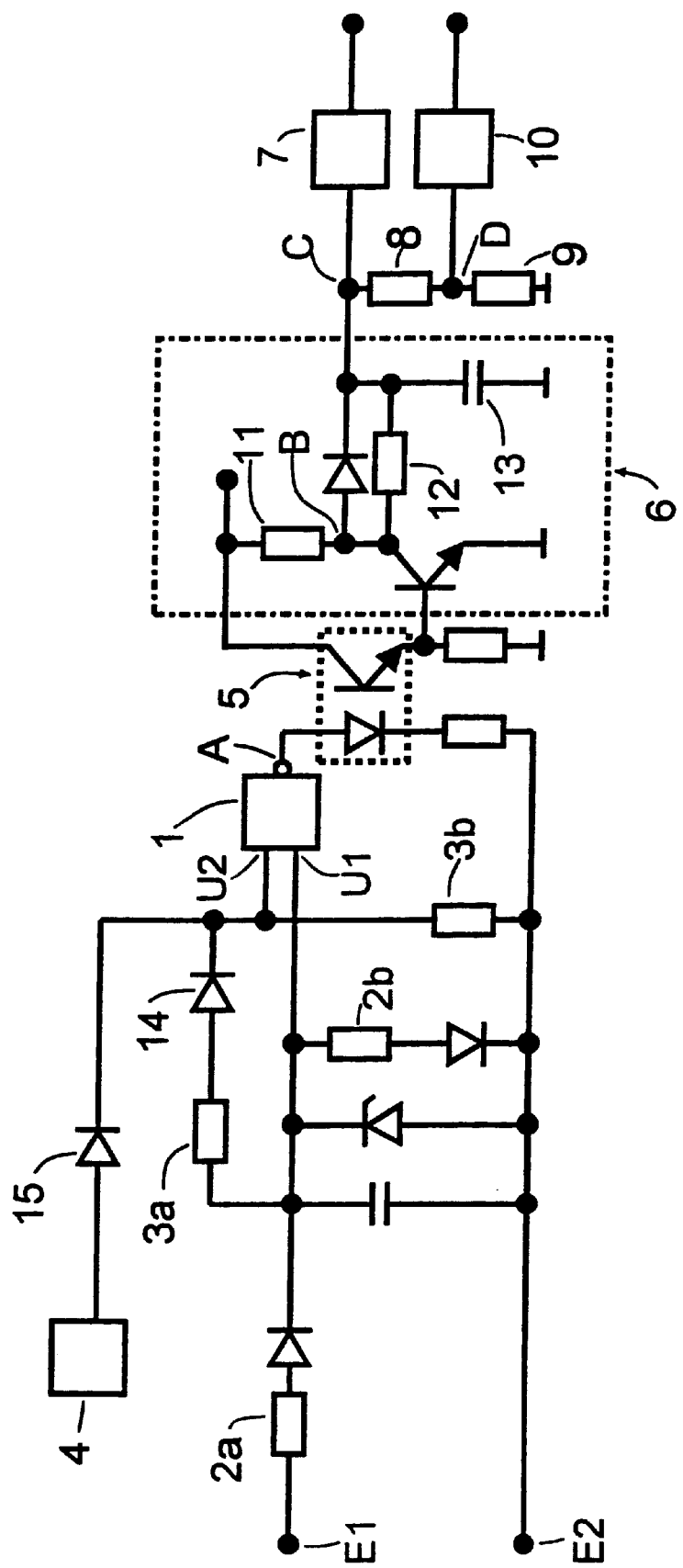

DIGITAL OUTPUT UNIT

FIELD OF THE INVENTION

The present invention relates to a digital input unit with means for detecting wire breakage and with at least one input channel to which an input signal can be supplied over a line; this input signal is transmitted by electrical isolating means of an evaluation unit that assigns the level states of the input signal above a first threshold to a logical "1" and the level states between a voltage greater than 0 V, but below a second threshold that is smaller than the first threshold, to a logical "0".

BACKGROUND INFORMATION

A digital input unit of this type is described in Siemens catalog ST 70, 1997 edition, pages 4/16 and 4/17. To enable electrical isolation, it is customary to provide each input channel with a first and a second optocoupler, one of which is provided to transmit the input signal, i.e., to transmit status information logical "0" and logical "1", while the other is provided to transmit wire breakage information to a wire breakage monitoring unit that monitors the lines connected to the input circuit.

SUMMARY

An object of the present invention is to simplify the transmission of status and wire breakage information in a digital input unit.

The digital input unit according to the present invention has the advantage that it requires only one optocoupler for transmitting the status and wire breakage information. This significantly improves EMC performance, particularly in digital input units with multiple input channels.

BRIEF DESCRIPTION OF THE DRAWINGS

The FIGURE shows an input circuit of an input channel of a digital input unit according to the present invention.

DETAILED DESCRIPTION

An input signal, whose level states correspond to a signal logical "1" above a first threshold of 8 V, a signal logical "0" between a voltage of 0 V and this 8 V threshold, and a signal logical "0" with wire breakage below a second threshold of 3 V, can be supplied to the input circuit via input terminals E1, E2. The input signal is supplied to a first input U1 of a NOR gate 1 operating at a voltage of 5 V via a first voltage divider 2a, 2b, and the input signal routed via a diode 14 and a second voltage divider 3a, 3b is supplied to a second input U2 of this gate 1. A clock generator 4 also applies a clock signal to second input U2 via a diode 15, with NOR gate 1 applying a logic signal logical "0", logical "1" or a clock frequency logic signal to its output A as a function of the input signal level and the clock signal level. This go logic signal is transmitted by an optocoupler 5 of an evaluation unit that includes an amplifier and filter unit 6, a voltage divider 8, 9, and a first and a second comparator 7, 10. A filter 12, 13 of amplifier and filter unit 6 filters the logic signal and applies the filtered logic signal to first comparator 7 and the filtered logic signal routed via voltage divider 8, 9 to second comparator 10. Comparators 7, 10 each compare the applied logic signal to a reference signal and generate binary output signals, with comparator 10 displaying the status information, i.e., an output signal logical "0", logical "1" and comparator 7 displaying an output signal "no wire breakage", as explained in greater detail below.

The function and operation of the input circuit are described in greater detail below. It is first assumed that input signal logical "1" is present at input terminals E1, E2, which corresponds to a voltage level greater than 8 V in the present example. Due to the dimensioning of voltage dividers 2a, 2b; 3a, 3b, the clock signal level cannot "pass through" as a result of the OR logic of diodes 14, 15, and input U2 of NOR gate 1 "detects" a status signal logical "1"-a voltage greater than the 2.5 V threshold voltage of NOR gate 1 is present at both inputs U1, U2 of NOR gate 1, causing NOR gate 1 to generate a logical "0" at the output. The transistor of optocoupler 5 blocks the circuit, producing a logical "1" at the point of connection B of amplifier and filter unit 6 and another logical "1" at inputs C, D of comparators 7, 10. Comparators 7, 10 each generate an output signal logical "1" at their outputs, indicating that no wire breakage has occurred and the output signal corresponds to a logical "1".

It is now assumed that an input signal logical "0" and "no wire breakage" are present at input terminals E1, E2, which corresponds to a voltage level greater than 3 V and less than 8 V in the present example. This signal is present at first input U1 of NOR gate 1 in the form of logical "1". At second input U2, the clock signal passes through, due to the dimensioning of voltage divider 3a, 3b, causing input U2 of NOR gate 1 to "detect" the clock. NOR gate 1 generates a clock frequency signal at its output A, and thus at the point of connection B of amplifier and filter unit 6, with filter 12, 13 of amplifier and filter unit 6 filtering this signal. The direct-voltage component of this filtered signal at input C of comparator 7 produces a logical "1" at the output of comparator 7, and the filtered signal routed via voltage divider 8, 9 at input D of comparator 10 produces a logical "0" at the latter's output. Signal logical "1" at the output of comparator 7 indicates that no wire breakage has occurred, and signal logical "0" at the output of comparator 10 indicates that the output signal corresponds to a logical "0".

It is now assumed that the supply line (not illustrated) to input terminal E1 is interrupted, producing an input voltage of 0 V at input terminals E1, E2. The NOR gate generates a logical "1" at its output A, causing the transistor of optocoupler 5 to complete the circuit. A logical "0" is present at both the point of connection B and inputs C, D of comparators 7, 10. Signal logical "0" at the output of comparator 7 indicates that a wire breakage has occurred, thus indicating that signal logical "0" at the output of comparator 10 was produced by the lack of an input signal and not by an input signal level corresponding to a logical "0".

What is claimed is:

1. A digital input unit including wire breakage detection, comprising:
   an input channel for receiving an input signal;
   a first voltage divider coupled to the input channel;
   a clock generator coupled to the voltage divider and generating a clock signal having a level which is less than a first threshold and greater than a second threshold, the input signal routed via the first voltage divider being superimposed on the clock signal;
   a logic circuit operating as a NOR gate and having a first input to which the input signal is supplied, and a second input to which the clock signal with the superimposed input signal is supplied;
   an electrical isolator; and
   an evaluation unit receiving a logic signal from the logic circuit via the isolator, the evaluation unit evaluating a direct voltage component of the logic signal and generating an output signal in a form of a status information logical "0" or logical "1" or a wire breakage output signal depending on the evaluation.

2. The digital input unit according to claim 1, wherein the evaluation unit includes a filter to which the logic signal is supplied, the filter providing a filtered logic signal, the evaluation unit further including a second voltage divider and a first comparator and a second comparator, each of the first and second comparators generating a binary output signal, the filter logic signal being supplied to the first comparator, the filtered logic signal, routed via the second voltage divider, being supplied to the second comparator, an output signal of the second comparator provided to display the status information logical "0" or logical "1", and an output signal of the first comparator provided to display a wire breakage.

3. The digital input unit according to claim 1, further comprising a plurality of input channels, each of the input channels being supplied the clock signal of the clock generator.

* * * * *